(12) United States Patent
Duan et al.

(10) Patent No.: US 11,239,295 B2
(45) Date of Patent: Feb. 1, 2022

(54) ORGANIC LIGHT-EMITTING DISPLAY DEVICES, METHODS FOR MANUFACTURING THE SAME, AND MASKS FOR MAKING SUPPORTING MEMBERS

(71) Applicant: KUNSHAN GO-VISIONOX OPTO-ELECTRONICS CO., LTD., Kunshan (CN)

(72) Inventors: Mengcong Duan, Kunshan (CN); Shaolei Yang, Kunshan (CN); Chao Chi Peng, Kunshan (CN); Wei Ao, Kunshan (CN); Jinfang Zhang, Kunshan (CN); Qingqing Wang, Kunshan (CN); Xuliang Wang, Kunshan (CN)

(73) Assignee: KUNSHAN GO-VISIONOX OPTO-ELECTRONIOS CO., LTD., Kunshan (CN)

( * ) Notice: Subject to any disclaimer, the term of this patent is extended or adjusted under 35 U.S.C. 154(b) by 0 days.

(21) Appl. No.: 16/874,678

(22) Filed: May 15, 2020

(65) Prior Publication Data

US 2020/0279898 A1    Sep. 3, 2020

Related U.S. Application Data

(63) Continuation-in-part of application No. PCT/CN2019/072146, filed on Jan. 17, 2019.

(30) Foreign Application Priority Data

Sep. 28, 2018  (CN) .......................... 201811142834.0

(51) Int. Cl.
*H01L 29/08* (2006.01)
*H01L 27/32* (2006.01)
(Continued)

(52) U.S. Cl.
CPC ...... *H01L 27/3246* (2013.01); *H01L 27/3272* (2013.01); *H01L 51/0011* (2013.01);
(Continued)

(58) Field of Classification Search
CPC ............. H01L 27/3218; H01L 27/3246; H01L 27/3272; H01L 51/56; H01L 51/0011; H01L 51/5206; H01L 51/5221
See application file for complete search history.

(56) References Cited

U.S. PATENT DOCUMENTS

2006/0109415 A1 * 5/2006 Ueda ................... G02F 1/13392
349/187
2010/0270538 A1   10/2010 Kang
(Continued)

FOREIGN PATENT DOCUMENTS

CN    101924070 A    12/2010
CN    102891107 A    1/2013
(Continued)

*Primary Examiner* — Phuc T Dang
(74) *Attorney, Agent, or Firm* — Kilpatrick Townsend & Stockton LLP

(57) ABSTRACT

The present disclosure provides an organic light-emitting device including a substrate, a pixel defining layer disposed on the substrate, a plurality of supporting members disposed on the pixel defining layer, and at least one organic light-emitting diode disposed on the substrate. The pixel defining layer defines a plurality of pixel regions. The plurality of pixel regions includes a plurality of first pixel regions, a plurality of second pixel regions, and a plurality of third pixel regions. The supporting members are located at first junction regions between the first pixel regions, the second pixel regions, and third pixel regions. 25 to 350 supporting members are provided on every square millimeter of the substrate. The organic light-emitting diode includes an anode, an organic light-emitting layer, and a cathode. The present disclosure further provides a method for manufac- (Continued)

turing the organic light-emitting device and a mask for making the supporting member.

19 Claims, 2 Drawing Sheets

(51) Int. Cl.
    *H01L 51/00*      (2006.01)
    *H01L 51/52*      (2006.01)
    *H01L 51/56*      (2006.01)

(52) U.S. Cl.
    CPC ...... *H01L 51/5206* (2013.01); *H01L 51/5221* (2013.01); *H01L 51/56* (2013.01)

(56) References Cited

U.S. PATENT DOCUMENTS

| | | | |
|---|---|---|---|
| 2012/0313844 A1* | 12/2012 | Im | H01L 27/3218 345/76 |
| 2015/0311473 A1 | 10/2015 | Kim et al. | |
| 2018/0226508 A1 | 8/2018 | Chen | |
| 2019/0027543 A1 | 1/2019 | Zhang et al. | |
| 2019/0165060 A1* | 5/2019 | Choi | H01L 51/0097 |

FOREIGN PATENT DOCUMENTS

| | | |
|---|---|---|
| CN | 105047683 A | 11/2015 |
| CN | 106653768 A | 5/2017 |
| CN | 107331791 A | 11/2017 |
| TW | 201523018 A | 6/2015 |
| TW | I606625 B | 11/2017 |
| TW | 201825695 A | 7/2018 |

* cited by examiner

ORGANIC LIGHT-EMITTING DISPLAY DEVICES, METHODS FOR MANUFACTURING THE SAME, AND MASKS FOR MAKING SUPPORTING MEMBERS

CROSS-REFERENCE TO RELATED APPLICATIONS

This application is a continuation-in-part under 35 U.S.C. § 120 of international patent application PCT/CN2019/072146 filed on Jan. 17, 2019, which claims priority from Chinese Patent Application No. 201811142834.0, filed on Sep. 28, 2018 at the China National Intellectual Property Administration. The contents of both applications are hereby incorporated by reference.

TECHNICAL FIELD

The present disclosure relates to the field of display technology.

BACKGROUND

The organic light-emitting diode (OLED) is an organic film electroluminescent device and has become an important part of display technology due to its advantages such as simple manufacturing process, low cost, high luminous efficiency, easy to form a flexible structure, and so on.

The OLEDs include a passive matrix OLED (PMOLED), an active matrix OLED (AMOLED), a transparent OLED, a top emission OLED, a foldable OLED, a white OLED, and so on. With respect to the AMOLED, the whole manufacturing process can be divided mainly into three stages, i.e., a back panel stage, a front panel stage, and a module stage.

The back panel stage is a stage of forming a thin film transistor (TFT) back panel which is configured to input a light-emitting signal and a stable power to the light-emitting device. In the front panel stage, materials, such as an organic light-emitting material and a cathode material, are deposited on the back panel via a fine metal mask (FMM) and combined with the drive circuit to form the light-emitting device, and then the light-emitting device is encapsulated in an oxygen-free environment to achieve a protecting effect.

SUMMARY

The present disclosure aims at measures for reducing damage to a supporting member. An organic light-emitting device capable of reducing the damage to the support member and having an excellent encapsulation effect, a method for manufacturing the organic light-emitting device, and a mask for making the supporting member are provided.

The organic light-emitting device includes a substrate, a pixel defining layer disposed on the substrate, a plurality of supporting members disposed on the pixel defining layer, and at least one organic light-emitting diode disposed on the substrate. The pixel defining layer defines a plurality of pixel regions. The plurality of pixel regions includes a plurality of first pixel regions, a plurality of second pixel regions, and a plurality of third pixel regions. The supporting members are located at first junction regions between the first pixel regions, the second pixel regions, and third pixel regions. 25 to 350 supporting members are provided on every square millimeter of the substrate. The organic light-emitting diode includes an anode, an organic light-emitting layer, and a cathode.

In an embodiment, each of the supporting members has a bottom portion facing the substrate, a top portion opposite to the bottom portion, and a side portion connecting the bottom portion and the top portion. An area of the bottom portion is smaller than or equal to an area of the first junction region. An area of the top portion is smaller than or equal to the area of the bottom portion.

In an embodiment, a taper angle between a side face of the side portion and a bottom face of the bottom portion of the supporting member is from 20° to 80°.

In an embodiment, the area of each of the first junction regions is larger than an area of a second junction region between any two adjacent pixel regions.

In an embodiment, widths, in a first direction, of the first pixel regions, the second pixel regions, and the third pixel regions are substantially the same. A length, in a second direction perpendicular to the first direction, of the third pixel region is larger than that of the first pixel region, and is larger than that of the second pixel region.

In an embodiment, the length of the third pixel regions is larger than the length of the first pixel region and is less than double the length of the first pixel region. The length of the third pixel regions is larger than the length of the second pixel region, and is less than double of the length of the second pixel region.

In an embodiment, the first pixel regions, the second pixel regions, and the third pixel regions are substantially in alignment with each other along the second direction and arranged alternatively in second width direction, to form a column of pixel regions. A second junction region between the first pixel region and the second pixel region adjacent to each other in one column is substantially in alignment with the corresponding third pixel region in an adjacent column, along the first direction.

In an embodiment, the supporting members are disposed at the first junction regions located adjacent to corners of the third pixel regions.

In an embodiment, the plurality of supporting members are uniformed distributed at the first junction regions.

In an embodiment, the substrate is a TFT substrate including a base and a plurality of thin film transistors disposed on the base.

In an embodiment, the supporting members are quadrangular pyramids or truncated quadrangular pyramids.

In an embodiment, the supporting members are configured such that top portions of the supporting members are unable to contact with edges of openings of a mask for forming the organic light emitting layer.

The method for manufacturing the organic light-emitting device, includes steps of: forming a pixel defining layer on a substrate, the pixel defining layer defining a plurality of pixel regions, the plurality of pixel regions comprising a plurality of first pixel regions, a plurality of second pixel regions, and a plurality of third pixel regions; forming supporting members at first junction regions between the first pixel regions, the second pixel regions, and the third pixel regions, the supporting members have a distribution density of 25 to 350 supporting members per square millimeter of the substrate; and forming at least one organic-light emitting diode including an anode, an organic light-emitting layer, and a cathode on the substrate.

In an embodiment, the supporting members are formed at the first junction regions uniformly distributed on the substrate.

In an embodiment, the supporting members are made by steps of: forming a photosensitive resin adhesive layer on the substrate by using a photosensitive resin adhesive; fixing a mask onto the photosensitive resin adhesive layer; and exposing, developing, and etching the photosensitive resin adhesive layer, thereby obtaining the supporting members at locations corresponding to exposure openings of the mask.

In an embodiment, widths, in a first direction, of the first pixel regions, the second pixel regions, and the third pixel regions are substantially the same. A length, in a second direction perpendicular to the first direction, of the third pixel region is larger than that of the first pixel region, and is larger than that of the second pixel region. The first pixel regions, the second pixel regions, and the third pixel regions are substantially in alignment with each other along the second direction and arranged alternatively in the second direction, to form a column of pixel regions. A second junction region between the first pixel region and the second pixel region adjacent to each other in one column is substantially in alignment with the corresponding third pixel region in an adjacent column, along the first direction. The supporting members are formed at the first junction regions located adjacent to corners of the third pixel regions.

In an embodiment, each the supporting members has a bottom portion facing the substrate, a top portion opposite to the bottom portion, and a side portion connecting the bottom portion and the top portion. An area of the bottom portion is smaller than or equal to an area of the first junction region. An area of the top portion is smaller than or equal to the area of the bottom portion. A taper angle between a side face of the side portion and a bottom face of the bottom portion of the supporting member is from 20° to 80°.

In an embodiment, the area of the bottom portion is smaller than the area of the first junction region.

The mask for making the supporting member in the organic light-emitting device includes a shielding plate defining a plurality of pixel defining regions and a plurality of openings extending through the shielding plate. The plurality of pixel defining regions includes a plurality of first pixel defining regions, a plurality of second pixel defining regions, and a plurality of third pixel defining regions. The openings are located at third junction regions between the first pixel defining regions, the second pixel defining regions, and the third pixel defining regions. 25 to 350 openings are provided on every square millimeter of the mask.

In an embodiment, widths, in a first direction, of the first pixel defining regions, the second pixel defining regions, and the third pixel defining regions are substantially the same. A length, in a second direction perpendicular to the first direction, of each of the third pixel defining regions is larger than that of the first pixel defining region and larger than that of the second defining pixel region. The first pixel defining regions, the second pixel defining regions, and the third pixel defining regions are substantially in alignment with each other along the second direction and arranged alternatively in the second direction to form a column of pixel defining regions. A fourth junction region between the first pixel defining region and the second pixel defining region adjacent to each other in one column is substantially in alignment with the corresponding third pixel defining region in an adjacent column, along the first direction. The openings are formed at the third junction regions located adjacent to corners of the third pixel defining regions.

In the organic light-emitting device of the present disclosure, by disposing the supporting member at the first junction region of the first pixel region, the second pixel region, and the third pixel region, the supporting member can have a relatively large diameter and a relatively high support ability, so as to well support the mask used in the subsequent process, moreover, a top portion of the supporting member will not contact with an edge of an opening of a fine metal mask for forming the organic light-emitting layer, thereby preventing the top portion of the supporting member from being scratched by the mask subsequently used and thus effectively avoiding the black spot caused by the scratch of the supporting member.

DETAILED DESCRIPTION

As explained above, the process of manufacturing OLEDS includes a back panel stage, a front panel stage, and a module stage. challenge in the front panel stage is to achieve an accurate deposition alignment and a gas-tightness of the encapsulation. In the module stage, the encapsulated panel is cut according to a size of an actual product, and attached with a polarizer, and the control circuit is attached to a chip. The product is then subjected to an aging test, packaged, and finally presented to users.

The present disclosure will now be described below in detail with reference to the specific embodiments shown in the accompanying drawings. However, these embodiments are not intended to limit the present disclosure. Modifications in structures, manners, or functions made by those skilled in the art according to these embodiments are all included in the protection scope of the present disclosure.

In the figures of the present disclosure, some dimensions of structures or portions may be exaggerated relative to other structures or portions for the purpose of illustration. Thus, the figures are merely used to illustrate basic structures of the present disclosure.

Generally, at least a supporting member (also referred as a spacer or a SPC) is disposed on a TFT back panel to support a mask used in the front panel stage. The supporting member is typically located at a junction region between a green pixel region and a blue pixel region. However, it was found in a tape-out of 5.99-inch flexible display screens that black spot defects frequently occurred in the reliability tests, and 80% of the black spot defects were caused by abnormalities of the supporting member. The abnormal supporting member can induce a breakage of the initial $SiN_x$ layer and an introduction of moisture and oxygen, which disables the encapsulation.

It is necessary to provide an organic light-emitting display device, a method for manufacturing the same, and a mask for making a supporting member during the manufacturing process to solve the technical problem as described above.

Figure 1:
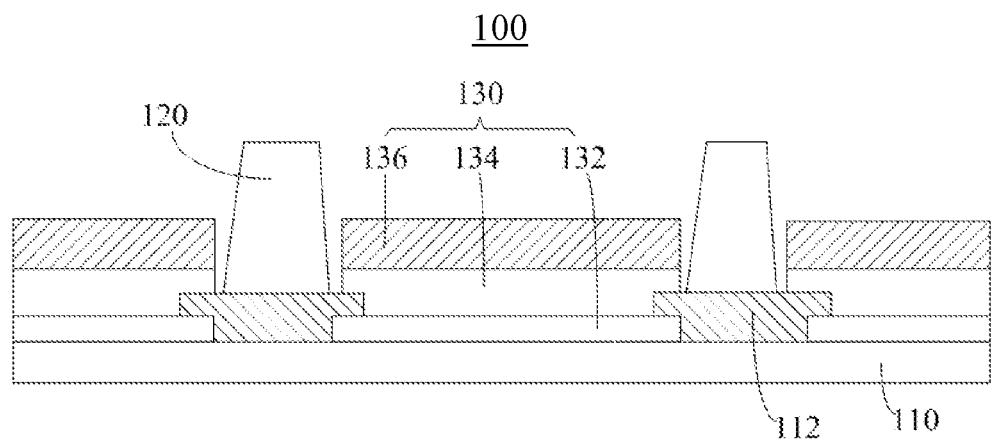
FIG. 1 is a schematic view of an organic light-emitting display device in an embodiment of the present disclosure.

Referring to FIG. 1, the organic light-emitting display device 100 of the present disclosure includes a substrate 110, a pixel defining layer 112 disposed on the substrate 110, a supporting member 120 located on the pixel defining layer 112, and an organic light-emitting diode 130 located on the substrate 110.

The substrate 110 is a TFT substrate including a base and a plurality of thin film transistors (TFT array) located on the base. The correspondence of the plurality of thin film transistors to a plurality of pixel regions of the organic light-emitting display device is well known in the art and will not be described in detail herein.

Figure 2:
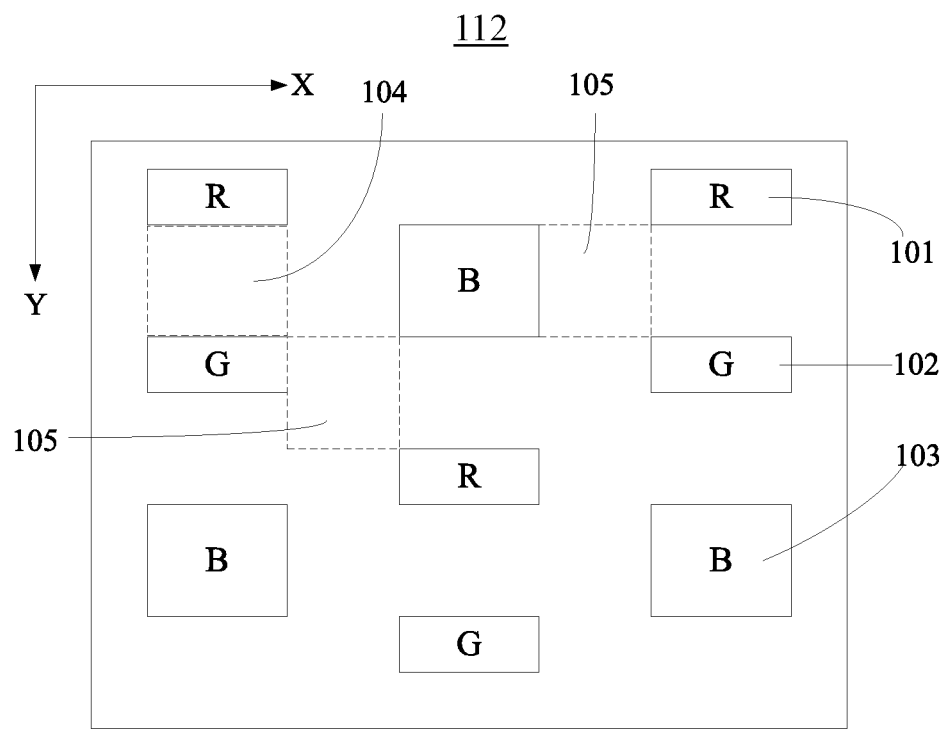
FIG. 2 is a schematic partial view of a pixel defining layer in an embodiment of the present disclosure.

Referring to FIG. 2, the pixel defining layer 112 defines a plurality of pixel regions. The plurality of pixel regions at least include a plurality of first pixel regions 101, a plurality of second pixel regions 102, and a plurality of third pixel regions 103. In an exemplary embodiment, the first pixel region 101 is a red (R) pixel region, the second pixel region 102 is a green (G) pixel region, and the third pixel region 103 is a blue (B) pixel region.

The arrangement of the plurality of pixel regions is not limited herein and can be any one of known arrangements in the art. In an embodiment, widths, in a first direction X, of the first pixel region 101, the second pixel region 102, and the third pixel region 103 are substantially the same; a length, in a second direction Y perpendicular to the first direction X, of the third pixel region 103 is larger than that of the first pixel region 101, and is larger than that of the second pixel region 102, respectively; the first pixel region 101, the second pixel region 102, and the third pixel region 103 are substantially in alignment with each other along a second direction Y and arranged alternatively in the second direction Y to form a column of pixel regions; and the pixel regions in two adjacent columns are offset with each other; specifically, a second junction region 104 between the first pixel region 101 and the second pixel region 102 adjacent to each other in one column is substantially in alignment with the third pixel region 103 in the adjacent column along the first direction X. More specifically, an edge of the second junction region 104 is in alignment with an edge of the third pixel region 103 in the first direction X, and another edge of the second junction region 104 is in alignment with another edge of the third pixel region 103 in the first direction X. A first junction region 105 between the first pixel region 101, the second pixel region 102, and the third pixel region 103 is located between any two adjacent columns.

In an embodiment, the length of the third pixel region 103 is larger than the length of the first pixel region 101, and smaller than or equal to twice of the length of the first pixel region 101. The length of the third pixel region 103 is larger than the length of the second pixel region 102, and smaller than or equal to twice of the length of the second pixel region 102.

Preferably, the length of the third pixel region 103 is substantially twice of the length of the first pixel region 101. The length of the third pixel region 103 is substantially twice of the length of the second pixel region 102.

In an embodiment, an area of the first junction region 105 located adjacent to an edge of the third pixel region 103 is smaller than an area of another first junction region 105 located adjacent to a corner of the third pixel region 103. In an embodiment, the supporting member 120 is disposed at the first junction region 105 located adjacent to the corner of the third pixel region 103 so as to achieve an excellent support ability and less abrasion caused by a mask used in the subsequent process.

The supporting member 120 is configured to support the mask used in the forming process of various layers/films during the manufacture of the organic light-emitting diode 130, and to support an encapsulation structure. The supporting member 120 is located at the first junction region 105 between the first pixel region 101, the second pixel region 102, and the third pixel region 103 in the present disclosure. It is to be understood by those skilled in the art that the first junction region 105 between the first pixel region 101, the second pixel region 102, and the third pixel region 103 refers to a region located between and contiguous respectively to the first pixel region 101, the second pixel region 102, and the third pixel region 103. A shape and a size of the first junction region 105 depend on the first pixel region 101, the second pixel region 102, and the third pixel region 103 surrounding it.

The area of the first junction region 105 between three types of pixel regions is larger than an area of a second junction region between any two adjacent pixel regions (such as the second junction region 104 between the first pixel region 101 and the second pixel region 102), so that the supporting member 120 can have a relatively large diameter and a relatively high support ability to well support the mask used in the subsequent process. Moreover, a top portion 124 of the supporting member 120 will not contact with an edge of an opening of a fine metal mask for forming an organic light-emitting layer, thereby preventing the top portion 124 of the supporting member 120 from being scratched by the mask subsequently used and thus effectively avoiding the black spot caused by the scratch of the supporting member 120.

The supporting member 120 can have a distribution density of 25 to 350 supporting members per square millimeter of the substrate. If the distribution density is too large, the occurrence probability of the black spot caused by the damage of the supporting member 120 will be increased; if the distribution density is too small, the support ability to the fine metal mask in the subsequent forming process of the organic light-emitting diode 130 will be weaken, and the supporting sites will be non-uniform, thereby tilting the fine metal mask and affecting the accuracy achieved in the forming process of the organic light-emitting diode 130.

In an embodiment, a plurality of supporting members 120 is uniformly distributed at a plurality of first junction regions 105 between three types of pixel regions to achieve an excellent supporting effect and keep the diodes made in respective regions consistent.

Figure 3:
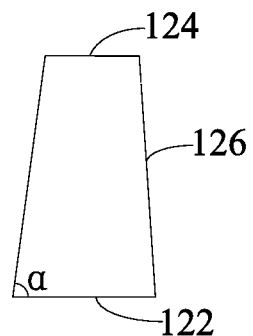
FIG. 3 is a schematic view of a supporting member in an embodiment of the present disclosure.

Furthermore, referring to FIG. 3, the supporting member 120 has a bottom portion 122 facing the substrate 110, a top portion 124 opposite to the bottom portion 122 and configured to support the mask used in the forming process of the organic light-emitting diode 130, and a side portion 126 connecting the bottom portion 122 and the top portion 124. An area of the bottom portion 122 is smaller than or equal to the area of the first junction region 105, and an area of the top portion 124 is smaller than or equal to the area of the bottom portion 122, so that the supporting member 120 can be formed at merely the first junction region 105, and thus will not affect the accuracy of other layers/films obtained in the forming process of the organic light-emitting diode 130 and can reduce the damage of the supporting member 120 in the subsequent process.

In an embodiment, the area of the bottom portion 122 is smaller than the area of the first junction region 105, so as to ensure that the supporting member 120 can be located at the first junction region 105 but not cover the pixel regions around the supporting member 120 even if the supporting member 120 is displaced due to the unavoidable fabrication error in the forming process of the supporting member 120, thereby avoiding the damage of the supporting member 120 in the subsequent process. Moreover, an abrasion of the supporting member 120 caused by the installation error of the mask can also be avoided in the subsequent forming process of the organic light-emitting diode 130.

A taper angle α formed between a side face of the side portion 126 and a bottom face of the bottom portion 122 of the supporting member 120 can be from 20° to 80°, so as to achieve a better support performance and ensure the accuracy of the subsequent process. It is to be understood by those skilled in the art that a height of the supporting member 120 is higher than that of the film/layer structure of the organic light-emitting diode 130. The area of the top portion 124 of the supporting member 120 depends on the area of the bottom portion 122, the taper angle α, and the height of the supporting member 120.

In an embodiment, the supporting member 120 is a quadrangular pyramid or a truncated quadrangular pyramid; the bottom portion 122 has a square shape with an edge length between 5 μm to 15 μm; the taper angle α formed between the side face of the side portion 126 and the bottom face of the bottom portion 122 is from 20° to 80°; the height of the supporting member 120 is higher than that of the film/layer structure of the organic light-emitting diode 130; and an edge length of the top portion 124 of the supporting member 120 depends on the edge length of the bottom portion 122, the taper angle α, and the height of the supporting member 120. For example, the edge length of the top portion 124 is 0 μm to 10 μm. In an exemplary embodiment, the bottom portion 122 has a square shape of 10 μm×10 μm, the taper angle α is 33°, and the top portion 124 has a square shape of 5 μm×5 μm.

The organic light-emitting diode 130 includes an anode 132, an organic-light emitting layer 134, and a cathode 136. A part of the anode 132 is covered by the pixel defining layer 112, and the other part of the anode 132 is exposed via the first pixel region 101, the second pixel region 102, or the third pixel region 103 defined by the pixel defining layer 112. The organic-light emitting layer 134 is located on the exposed part of the anode 132 and configured to emit different color lights, such as red lights, green lights, blue lights, and so on. The cathode 136 is located on the organic light-emitting layer 134.

The organic light-emitting device 100 can further include an encapsulation structure disposed opposite to the substrate 110. Specific structures, functions, relative position relationships, and making methods of the TFT back panel, the pixel defining layer 112, the organic-light emitting diode 130, and the encapsulation structure can be referred to the prior arts and will not described in detail herein.

A method for manufacturing an organic light-emitting device 100 is further provided in the present disclosure. The method includes steps of:

S1, forming a pixel defining layer 112 on a substrate 110, wherein the pixel defining layer 112 defines a plurality of pixel regions, the plurality of pixel regions includes at least a plurality of first pixel regions 101, a plurality of second pixel regions 102, and a plurality of third pixel regions 103, exemplarily, the first pixel region 101 is a red (R) pixel region, the second pixel region 102 is a green (G) pixel region, and the third pixel region 103 is a blue (B) pixel region;

S2, forming a supporting member 120 at a first junction region 105 between the first pixel region 101, the second pixel region 102, and the third pixel region 103; and S3, forming an organic-light emitting diode 130 onto the substrate 110, wherein the organic-light emitting diode 130 includes an anode 132, an organic light-emitting layer 134, and a cathode 136.

It is to be understood by those skilled in the art that the first junction region 105 between the first pixel region 101, the second pixel region 102, and the third pixel region 103 refers to a region located between and contiguous respectively to the first pixel region 101, the second pixel region 102, and the third pixel region 103. A shape and a size of the first junction region 105 depend on the first pixel region 101, the second pixel region 102, and the third pixel region 103 surrounding it. By forming the supporting member 120 at the first junction region 105, the supporting member 120 can have a relatively large diameter and a relatively high support ability to well support the mask used in the subsequent process; moreover, a top portion 124 of the supporting member 120 will not contact with an edge of an opening of a fine metal mask for forming the organic light-emitting layer 136, thereby preventing the top portion 124 of the supporting member 120 from being scratched by the mask subsequently used and thus effectively avoiding the black spot caused by the scratch of the supporting member 120.

The arrangement of the plurality of pixel regions is not limited herein and can be any one of known arrangements in the art. In an embodiment, widths, in a first direction X, of the first pixel region 101, the second pixel region 102, and the third pixel region 103 are substantially the same; a length, in a second direction Y perpendicular to the first direction Y, of the third pixel region 103 is larger than that of the first pixel region 101, and is larger than that of the second pixel region 102, respectively; the first pixel region 101, the second pixel region 102, and the third pixel region 103 are substantially in alignment with each other along the second direction Y and arranged alternatively in the second direction Y to form a column of pixel regions; and the pixel regions in two adjacent columns are offset with each other; specifically, a first junction region 104 between the first pixel region 101 and the second pixel region 102 in one column is substantially in alignment with the third pixel region 103 in the adjacent column along the first direction X; more specifically, an edge of the second junction region 104 is in alignment with an edge of the third pixel region 103 in the first direction X, and another edge of the second junction region 104 is in alignment with another edge of the third pixel region 103 in the first direction X. The first junction region 105 between the first pixel region 101, the second pixel region 102, and the third pixel region 103 is located between any two adjacent columns.

In an embodiment, the length of the third pixel region 103 is larger than the length of the first pixel region 101, and smaller than or equal to twice of the length of the first pixel region 101. The length of the third pixel region 103 is larger than the length of the second pixel region 102, and smaller than or equal to twice of the length of the second pixel region 102.

In an exemplary embodiment, the length of the third pixel region 103 is substantially twice of the length of the first pixel region 101. The length of the third pixel region 103 is substantially twice of the length of the second pixel region 102.

In an embodiment, an area of the first junction region 105 located adjacent to an edge of the third pixel region 103 is smaller than an area of another first junction region 105 located adjacent to a corner of the third pixel region 103. In an embodiment, the supporting member 120 is disposed at the first junction region 105 located adjacent to the corner of the third pixel region 103 so as to achieve an excellent support ability and less damage caused by a mask used in the subsequent process.

The substrate 110 is a TFT back panel. A method for making the TFT back panel includes a step of forming an array of thin film transistors (TFT array) on a base substrate, such as a glass or plastic base substrate, to obtain the TFT back panel. The correspondence between the TFT array and the pixel regions is well known and will not be described in detail herein.

A method for forming the pixel defining layer on the TFT back panel is well known and will not be described in detail herein.

A method for forming the supporting member 120 can include steps of: coating a photosensitive resin adhesive on the substrate to form a photosensitive resin adhesive layer; fixing a mask on the photosensitive resin adhesive layer; and exposing, developing, and etching the photosensitive resin adhesive layer, thereby obtaining the supporting member 120 at a location corresponding to an exposure opening of the mask.

In an embodiment, 25 to 350 supporting members 120 are made on every square millimeters of the substrate by the above-described method. If the distribution density of the supporting members 120 is too large, the occurrence probability of the black spot caused by the damage of the supporting member 120 will be increased; if the distribution density of the supporting members 120 is too small, the support ability to the fine metal mask in the subsequent forming process of the organic light-emitting diode 130 will be weaken and the supporting sites will be non-uniform, thereby tilting the fine metal mask and affecting the accuracy achieved in the forming process of the organic light-emitting diode 130.

In an embodiment, the supporting member 120 is formed at each of a plurality of first junction regions 105 uniformly distributed on the substrate 110, thereby obtaining a plurality of supporting members 120 uniformly distributed at the plurality of first junction regions 105 between the three types of pixel regions to achieve an excellent supporting effect and keep the diodes made in respective regions consistent.

Furthermore, a shape/structure of the supporting member 120 is controlled by regulating parameters of the exposure process, such as an intensity of the exposure, an amount of the exposure, and an incidence direction of lights, such that the formed supporting member 120 has a bottom portion 122 facing the substrate 110, a top portion 124 opposite to the bottom portion 122 and configured to support the mask used in the forming process of the organic light-emitting diode 130, and a side portion 126 connecting the bottom portion 122 and the top portion 124. An area of the bottom portion 122 is smaller than or equal to the area of the first junction region 105 between the first, second, and third pixel regions, and an area of the top portion 124 is smaller than or equal to the area of the bottom portion 122, so that the whole supporting member 120 is only formed at the first junction region 105, thereby not affecting the accuracy of other layers/films obtained in the forming process of the organic light-emitting diode 130 and reducing the damage of the supporting member 120 in the subsequent process.

In an embodiment, the area of the bottom portion 122 is smaller than the area of the first junction region 105, so as to ensure that the supporting member 120 can be located at the first junction region 105 but not cover the pixel region even if the supporting member 120 is displaced due to a fabrication error in the forming process of the supporting member 120, thereby avoiding the abrasion of the supporting member 120 in the subsequent process; moreover, an damage of the supporting member 120 caused by the installation error of the mask can also be avoided in the subsequent forming process of the organic light-emitting diode 130.

A taper angle α formed between a side face of the side portion 126 and a bottom face of the bottom portion 122 of the supporting member 120 can be from 20° to 80°, so as to achieve a better support performance and ensure the accuracy of the subsequent process.

In an embodiment, the supporting member 120 made by the above-described method is a quadrangular pyramid or a truncated quadrangular pyramid; the bottom portion 122 has a square shape with an edge length between 5 μm to 15 μm; the taper angle α formed by the side face of the side portion 126 and the bottom face of the bottom portion 122 is from 20° to 80°; the height of the supporting member 120 is higher than that of the film/layer structure of the organic light-emitting diode 130; and an edge length of the top portion 124 of the supporting member 120 depends on the edge length of the bottom portion 122, the taper angle α, and the height of the supporting member 120. For example, the edge length of the top portion 124 is 0 μm to 10 μm. In an exemplary embodiment, the bottom portion 122 has a square shape of 10 μm×10 μm, the taper angle α is 33°, and the top portion 124 has a square shape of 5 μm×5 μm.

In the present disclosure, an anode 132 of the organic light-emitting diode 130 is formed on the TFT back panel before forming the pixel defining layer 112. A method for making the organic light-emitting diode 130 includes steps of: forming an array of anodes 132 corresponding to the TFT array onto the TFT back panel, a part of the anode 132 is covered by the subsequently formed pixel defining layer 112, and the other part of the anode 132 is exposed via the first pixel region 101, the second pixel region 102, or the third pixel region 103 defined by the pixel defining layer 112; forming light emitting layers configured to emit different color lights, such as red lights, green lights, blue lights, and so on, on the exposed parts of the anodes 132 to constitute the organic-light emitting layer 134; and forming a cathode 136 on the organic-light emitting layer 134 to obtain an array of the organic light-emitting diodes 130.

Figure 4:
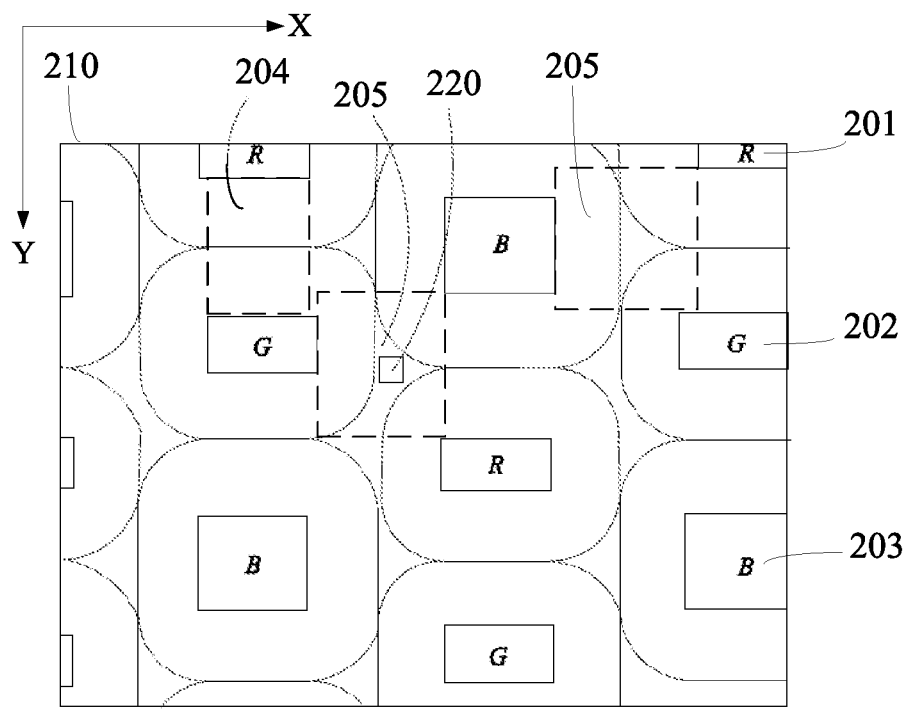
FIG. 4 is a schematic partial view of a mask in an embodiment of the present disclosure.

Referring to FIG. 4, a mask 200 for forming the supporting member 120 is further provided in the present disclosure. The mask 200 is a shielding plate 210 provided with a plurality of openings 220 extending through the shielding plate 210. It is to be understood by those skilled in the art that the shielding plate 210 is configured to shield against lights and the opening 220 is configured to enable the lights to pass through.

The shielding plate 210 having a plurality of pixel defining regions. The plurality of pixel defining regions includes at least a plurality of first pixel defining regions 201, a plurality of second pixel defining regions 202, and a plurality of third pixel defining regions 203 corresponding to the plurality of first pixel regions 101, the plurality of second pixel regions 102, and the plurality of third pixel regions 103 in a one to one manner. The opening 220 is located at a third junction region 205 between the first pixel defining region 201, the second pixel defining region 202, and the third pixel defining region 203.

The pixel defining regions 201, 202, and 203 of the shielding plate 210 are corresponding to the pixel regions 101, 102 and 103 defined by the pixel defining layer 112. The third junction region 205 is corresponding to the first junction region 105 between the first pixel region 101, the second pixel region 102, and the third pixel region 103. A location of the opening 220 is corresponding to a location of the supporting member 120.

Correspondingly, the third junction region 205 between the first pixel defining region 201, the second pixel defining region 202, and the third pixel defining region 203 refers to a region located between and contiguous respectively to the first pixel defining region 201, the second pixel defining region 202, and the third pixel defining region 203. A shape and a size of the third junction region 205 depend on the first pixel defining region 201, the second pixel defining region 202, and the third pixel defining region 203 surrounding it. As such, the supporting member 120 formed via the mask 200 is located at the first junction region 105 of the first pixel region 101, the second pixel region 102, and the third pixel region 103. An area of the third junction region 205 between the three types of pixel defining regions is larger than a fourth junction region between any two adjacent pixel defining regions, so that the supporting member 120 formed via the mask 200 can have a relatively large diameter and a relatively high support ability to well support the mask used in the subsequent process; Moreover, a top portion 124 of the supporting member 120 will not contact with an edge of an opening of a fine metal mask for forming the organic light-emitting layer 136, thereby preventing the top portion 124 of the supporting member 120 from being scratched by the mask subsequently used and thus effectively avoiding the black spot caused by the scratch of the supporting member 120.

In an exemplary embodiment, the first pixel defining region 201 is corresponding to a red (R) pixel region, the second pixel defining region 202 is corresponding to a green (G) pixel region, and the third pixel defining region 203 is corresponding to a blue (G) pixel region. The arrangement of the plurality of pixel defining regions on the mask 200 is not limited herein and can be any one of known arrangements in the art. In an embodiment, widths, in a first direction X, of the first pixel defining region 201, the second defining pixel region 202, and the third defining pixel region 203 are substantially the same; a length, in a second direction Y perpendicular to the first direction X, of the third pixel defining region 203 is larger than that of the first pixel defining region 201, and is larger than that of the second pixel defining region 202, respectively; the first pixel defining region 201, the second pixel defining region 202, and the third pixel defining region 203 are substantially in alignment with each other along a the second direction Y and arranged alternatively in the first second direction Y to form a column of pixel defining regions; and the pixel defining regions in two adjacent columns are offset with each other; specifically, a fourth junction region 204 between the first pixel defining region 201 and the second pixel defining region 202 in one column is substantially in alignment with the third pixel defining region 203 in the adjacent column along the first direction X; more specifically, an edge of the fourth junction region 204 is in alignment with an edge of the third pixel defining region 203 in the first direction X, and another edge of the fourth junction region 1204 is in alignment with another edge of the third pixel defining region 203 in first direction X. The third junction region 205 between the first pixel defining region 201, the second pixel defining region 202, and the third pixel defining region 203 is located between any two adjacent columns.

In an embodiment, the length of the third pixel defining region 203 is larger than the length of the first pixel defining region 201, and smaller than or equal to twice of the length of the first pixel defining region 201. The length of the third pixel defining region 203 is larger than the length of the second pixel defining region 202 and smaller than or equal to twice of the length of the second pixel defining region 202.

In an exemplary embodiment, the length of the third pixel defining region 203 is substantially twice of the length of the first pixel defining region 201. The length of the third pixel defining region 203 is substantially twice of the length of the second pixel defining region 202.

In an embodiment, an area of the third junction region 205 located adjacent to an edge of the third pixel defining region 203 is smaller than an area of another third junction region 205 located adjacent to a corner of the third pixel defining region 203. In an embodiment, the opening 220 is disposed at the third junction region 205 located adjacent to the corner of the third pixel defining region 203 so as to achieve an excellent support ability and less damage caused by a mask used in the subsequent process.

An area of the opening 220 is smaller than or equal to the area the third junction region 205 between the first pixel defining region 201, the second pixel defining region 202, and the third pixel defining region 203, so that the supporting member 120 can be formed merely at the third junction region 205, thereby not affecting the accuracy of other films/layers made in the subsequent process and reducing the damage of the supporting member 120 in the subsequent process.

In an embodiment, the area of the opening 220 is smaller than the area of the third junction region 205, so as to ensure the supporting member 120 can be located at the first junction region 105 but not cover the pixel region around the supporting member 120 even if the supporting member 120 is displaced due to the fabrication error in the forming process of the supporting member 120, thereby avoiding the damage of the supporting member 120 in the subsequent process.

The opening 220 can have a distribution density of 25 to 350 openings per square millimeter of the mask 200. If the distribution density is too large, the amount of supporting member 120 formed will also be too large, thereby increasing the occurrence probability of the black spot caused by the damage of the supporting member 120; if the distribution density is too small, the amount of supporting member 120 formed will also be too small, so that the support ability to the fine metal mask in the subsequent forming process of the organic light-emitting diode 130 will be weaken and the supporting sites will be non-uniform, thereby tilting the fine metal mask and affecting the accuracy achieved in the forming process of the organic light-emitting diode 130.

In an embodiment, a plurality of openings 220 is uniformly distributed at a plurality of the third junction regions 205.

In the organic light-emitting device of the present disclosure, by disposing the support at the first junction region between the first pixel region, the second pixel region, and the third pixel region, the support can have a relatively large diameter and a relatively high support ability, so as to well support the mask used in the subsequent process; moreover, a top surface of the support will not contact with an edge of an opening of a fine metal mask for forming the organic light-emitting layer, thereby preventing the top surface of the support from being scratched by the mask subsequently used and thus effectively avoiding the black spot caused by the scratch of the support.

It to be understood that although the present specification is described by the embodiments, it is not indicates that each embodiment includes only one independent technical solution. The way of description of the present specification is merely for clarity. Those skilled in the art should consider the specification as a whole. Solutions in various embodiments may be combined appropriately to form other embodiments understandable to those skilled in the art.

The series of detailed description listed above are merely detailed description for feasible embodiments of the application, which are not to limit the scope of the application. Any equivalent embodiment or modification without departing from the art and spirit of the application should be contained within the scope of the application.

What is claimed is:

1. An organic light-emitting device, comprising:
   a substrate;
   a pixel defining layer disposed on the substrate, the pixel defining layer defining a plurality of pixel regions, the plurality of pixel regions comprising a plurality of first pixel regions, a plurality of second pixel regions, and a plurality of third pixel regions;
   a plurality of supporting members disposed on the pixel defining layer, the supporting members being located at first junction regions between the first pixel regions, the second pixel regions, and third pixel regions, and 25 to 350 supporting members being provided on every square millimeter of the substrate; and
   at least one organic light-emitting diode disposed on the substrate, the organic light-emitting diode comprising an anode, an organic light-emitting layer, and a cathode;
   wherein each of the supporting members has a bottom portion facing the substrate, a top portion opposite to the bottom, and a side portion connecting the bottom portion and the top portion; an area of the bottom portion is smaller than or equal to an area of the first junction region; and an area of the top portion is smaller than or equal to the area of the bottom portion.

2. The organic light-emitting device of claim 1, wherein a taper angle between a side face of the side portion and a bottom face of the bottom portion of the supporting member is from 20° to 80°.

3. The organic light-emitting device of claim 1, wherein the area of each of the first junction regions is larger than an area of a second junction region between any two adjacent pixel regions.

4. The organic light-emitting device of claim 1, wherein widths, in a first direction, of the first pixel regions, the second pixel regions, and the third pixel regions are substantially the same;
   a length, in a second direction perpendicular to the first direction, of the third pixel region is larger than that of the first pixel region, and is larger than that of the second pixel region.

5. The organic light-emitting device of claim 4, wherein the length of the third pixel regions is larger than the length of the first pixel region and is less than double the length of the first pixel region,
   the length of the third pixel regions is larger than the length of the second pixel region, and is less than double of the length of the second pixel region.

6. The organic light-emitting device of claim 5, wherein the first pixel regions, the second pixel regions, and the third pixel regions are substantially in alignment with each other along the second direction and arranged alternatively in the second direction, to form a column of pixel regions; and
   a second junction region between the first pixel region and the second pixel region adjacent to each other in one column is substantially in alignment with the corresponding third pixel region in an adjacent column, along the first direction.

7. The organic light-emitting device of claim 6, wherein the supporting members are disposed at the first junction regions located adjacent to corners of the third pixel regions.

8. The organic light-emitting device of claim 1, wherein the plurality of supporting members are uniformly distributed at the first junction regions.

9. The organic light-emitting device of claim 1, wherein the substrate is a TFT substrate comprising a base and a plurality of thin film transistors disposed on the base.

10. The organic light-emitting device of claim 1, wherein the supporting members are quadrangular pyramids or truncated quadrangular pyramids.

11. The organic light-emitting device of claim 1, wherein the supporting members are configured such that top portions of the supporting members are unable to contact with edges of openings of a mask for forming the organic light emitting layer.

12. A method for manufacturing an organic light-emitting device, comprising steps of:
   forming a pixel defining layer on a substrate, the pixel defining layer defining a plurality of pixel regions, the plurality of pixel regions comprising a plurality of first pixel regions, a plurality of second pixel regions, and a plurality of third pixel regions;
   forming supporting members at first junction regions between the first pixel regions, the second pixel regions, and the third pixel regions, the supporting members have a distribution density of 25 to 350 supporting members per square millimeter of the substrate; and
   forming at least one organic-light emitting diode comprising an anode, an organic light-emitting layer, and a cathode on the substrate;
   wherein each of the supporting members has a bottom portion facing the substrate, a top portion opposite to the bottom portion, and a side portion connecting the bottom portion and the top portion; an area of the bottom portion is smaller than or equal to an area of the first junction region; an area of the top portion is smaller than or equal to the area of the bottom portion; and a taper angle between a side face of the side portion and a bottom face of the bottom portion of the supporting member is from 20° to 80°.

13. The method of claim 12, wherein the supporting members are formed at the first junction regions uniformly distributed on the substrate.

14. The method of claim 12, wherein the supporting members are made by steps of:
   forming a photosensitive resin adhesive layer on the substrate by using a photosensitive resin adhesive;
   fixing a mask onto the photosensitive resin adhesive layer; and
   exposing, developing, and etching the photosensitive resin adhesive layer, thereby obtaining the supporting members at locations corresponding to exposure openings of the mask.

15. The method of claim 12, wherein widths, in a first direction, of the first pixel regions, the second pixel regions, and the third pixel regions are substantially the same;
   a length, in a second direction perpendicular to the first direction, of the third pixel region is larger than that of the first pixel region, and is larger than that of the second pixel region;
   the first pixel regions, the second pixel regions, and the third pixel regions are substantially in alignment with each other along the second direction and arranged alternatively in the second direction, to form a column of pixel regions;
   a second junction region between the first pixel region and the second pixel region adjacent to each other in one column is substantially in alignment with the corresponding third pixel region in an adjacent column, along the first direction; and
   the supporting members are formed at the first junction regions located adjacent to corners of the third pixel regions.

16. The method of claim 12, wherein the area of the bottom portion is smaller than the area of the first junction region.

17. An organic light-emitting device, comprising:
- a substrate;
- a pixel defining layer disposed on the substrate, the pixel defining layer defining a plurality of pixel regions, the plurality of pixel regions comprising a plurality of first pixel regions, a plurality of second pixel regions, and a plurality of third pixel regions;
- a plurality of supporting members disposed on the pixel defining layer, the supporting members being located at first junction regions between the first pixel regions, the second pixel regions, and third pixel regions; and
- at least one organic light-emitting diode disposed on the substrate, the organic light-emitting diode comprising an anode, an organic light-emitting layer, and a cathode;
- wherein the supporting members are configured such that top portions of the supporting members are unable to contact with edges of openings of a mask for forming the organic light emitting layer.

18. The organic light-emitting device of claim 17, wherein a height of each of the supporting members is higher than a height of the organic light-emitting diode.

19. The organic light-emitting device of claim 17, wherein each of the supporting members comprises a bottom portion facing the substrate, an area of the bottom portion is smaller than or equal to an area of the first junction region.

* * * * *